United States Patent
Jang et al.

(10) Patent No.: US 8,214,581 B2
(45) Date of Patent: Jul. 3, 2012

(54) SYSTEM AND METHOD FOR CACHE SYNCHRONIZATION

(75) Inventors: Jun-ho Jang, Seoul (KR); Woon-jae Chung, Gunpo-si (KR); Joon-ho Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 438 days.

(21) Appl. No.: 12/629,989

(22) Filed: Dec. 3, 2009

(65) Prior Publication Data

US 2010/0146193 A1 Jun. 10, 2010

(30) Foreign Application Priority Data

Dec. 8, 2008 (KR) .................. 10-2008-0124302

(51) Int. Cl.
*G06F 12/00* (2006.01)
(52) U.S. Cl. ............................................. 711/103
(58) Field of Classification Search ............ None
See application file for complete search history.

(56) References Cited

U.S. PATENT DOCUMENTS

| | | | |
|---|---|---|---|
| 6,480,936 B1 | 11/2002 | Ban et al. | |
| 7,793,065 B2 * | 9/2010 | Gill et al. | 711/171 |
| 7,903,930 B2 * | 3/2011 | Fujita et al. | 386/240 |

FOREIGN PATENT DOCUMENTS

| | | |
|---|---|---|
| JP | 09114598 | 5/1997 |
| JP | 10254780 | 9/1998 |
| JP | 2000003309 | 1/2000 |

* cited by examiner

*Primary Examiner* — Hiep Nguyen
(74) *Attorney, Agent, or Firm* — Volentine & Whitt, PLLC

(57) ABSTRACT

A system for cache synchronization includes a data managing unit and a storage medium. The data managing unit is configured to control storing of data of a buffer cache of the storage medium, in response to an event signal received from a host, by classifying the data of the buffer cache into random data and sequential data. The storage medium includes a first area and a second area, and is configured to store the random data and an address information map in the first area, and to store the sequential data in the second area.

17 Claims, 2 Drawing Sheets

SYSTEM AND METHOD FOR CACHE SYNCHRONIZATION

CROSS-REFERENCE TO RELATED APPLICATIONS

A claim of priority is made to Korean Patent Application No. 10-2008-0124302, filed on Dec. 8, 2008, in the Korean Intellectual Property Office, the subject matter of which is hereby incorporated by reference.

BACKGROUND

The inventive concept relates to a flash memory system, and more particularly, to cache synchronization performed on a flash memory device-based storage medium, where fast power-off is achieved.

A flash memory device is a highly integrated non-volatile memory device. Because flash memory devices have excellent data retention, flash memory devices can be used as the main memory type in memory systems. Also, because flash memory devices are highly integrated, large storage capacity devices, they are replacing conventional hard disk drives (HDD) and conventional floppy disk drives. For example, flash memory devices are currently used as storage media in mobile phones, digital cameras, MPEG-1 Audio Layer 3 (MP3) players, solid-state drives (SSDs), etc.

A flash memory device-based storage medium is an external recording device of a host computer. However, flash memory devices have low data input/output speeds since they take a relatively long time to fetch data stored in a memory cell array to a page buffer, and to write data temporarily stored in the page buffer to the memory cell array.

Flash memory devices are formed of multiple blocks, e.g., 1024 blocks, 2048 blocks, etc. Each block is fanned of multiple sectors, e.g., 16 sectors, 32 sectors, 64 sectors, etc. With respect to flash memory devices, data erase operations are performed in units of blocks, and write and read operations are performed in units of pages. In flash memory devices, erase operations have to precede write operations. That is, flash memory devices manage data a block at a time, so that performance of write operations fluctuates.

Meanwhile, data write and read processing speeds in a storage medium are lower than the data transmission processing speed between the storage medium and the host computer. Thus, a cache memory is arranged between the storage medium and the host computer, and data transmission is performed using the cache memory so that the data write processing speed and/or the data read processing speed can be increased. The cache memory can be operated by sequential access, where data addresses exchanged with the host computer are accessed sequentially, or by random access, where the data addresses are accessed randomly. The cache memory may be a volatile memory device, such as dynamic random access memory (DRAM) or static random access memory (SRAM), or a non-volatile memory device, such as a flash memory device.

In a system including the storage medium and the cache memory, when an event such as a power-off from a higher application occurs, a cache synchronization operation is required to re-store data stored in the cache memory into the storage medium. When a non-volatile memory device is used as the cache memory, the cache synchronization operation is not necessary. However, when a volatile memory device is used as the cache memory, the cache synchronization operation needs to be performed with the flash memory device that is the storage medium.

In terms of data processing, a file refers to a collection of related records, and a file system refers to a system of naming files and indicating file locations, such that the files are logically ordered to accommodate file location for storage and retrieval. A file system using a flash memory device includes functions for managing the files, storing the files in the flash memory device, and reading the files from the flash memory device.

However, a cache synchronization operation performed by a file system may induce random write operations of the flash memory device. In random write operations, areas to be occupied by the files in the flash memory device are randomly distributed, such that the size of a memory area required for the cache synchronization operation may not be sufficiently large. Also, in order to minimize the number of random write operations into the flash memory device, when data stored in the cache memory are grouped according to physical addresses and when data in a large group are first stored in the flash memory device, synchronization time is reduced compared to that of a Least Recently Used (LRU)-based cache synchronization technique. However, the effect thereof is limited.

Therefore, a cache synchronization method for a fast power-off is required to be performed on the flash memory device.

SUMMARY

According to an aspect of the inventive concept, there is provided a system for cache synchronization, including a data managing unit and a storage medium. The data managing unit is configured to control storing of data of a buffer cache of the storage medium, in response to an event signal received from a host, by classifying the data of the buffer cache into random data and sequential data. The storage medium includes a first area and a second area, and is configured to store the random data and an address information map in the first area, and to store the sequential data in the second area.

The address information map may include information representing a relationship between physical addresses of the random data stored in the buffer cache and physical addresses of the random data stored in the first area of the storage medium.

The event signal may correspond to a power-off signal, indicating a power-off condition of the system. Also, the data managing unit restores the random data stored in the first area of the storage medium to the buffer cache according to the address information map in response to a power-on signal, indicating a power-on condition of the system.

The storage medium may include a flash memory device, in which the first area and the second area are distinguished.

According to another aspect of the inventive concept, there is provided a system for cache synchronization including a data managing unit and a storage medium. The data managing unit provides a journaling function for storing log information and, in response to an event signal received from a host, stores data of a buffer cache of a storage medium by classifying the data of the buffer cache into random data and sequential data, and provides an address information map including information representing a relationship between physical addresses of the random data stored in the buffer cache and physical addresses of the random data stored in the storage medium. The storage medium includes a journaling area for storing the log information. The storage medium stores the random data along with the address information map in the journaling area, and stories the sequential data in an area other than the journaling area.

According to another aspect of the inventive concept, there is provided a system for cache synchronization including a data managing unit and a storage medium. The data managing unit provides a function for managing an unused area in a storage medium and, in response to an event signal received from a host, stores data of a buffer cache in the storage medium by classifying the data stored in the buffer cache into random data and sequential data, and which provides an address information map for indicating a relationship between physical addresses of the random data stored in the buffer cache and physical addresses of the random data stored in the storage medium. The storage medium includes an area divided into the unused area and a used area. The storage medium stores the random data along with the address information map in the unused area, and stores the sequential data in the used area.

According to another aspect of the inventive concept, there is provided a cache synchronization method. The method includes receiving an event signal from a host; storing data of a buffer cache in a storage medium in response to the event signal by classifying the data of the buffer cache into random data and sequential data, and providing an address information map for indicating information representing a relationship between physical addresses of the random data stored in the buffer cache and physical addresses of the random data stored in the storage medium, in response to the event signal; storing the random data and the address information map in a first area of the storage medium; and storing the sequential data in a second area in the storage medium.

The first area may indicate a journaling area in the storage medium for storing log information, or the first area may correspond to an unused area in the storage medium.

BRIEF DESCRIPTION OF THE DRAWINGS

Various embodiments of the inventive concept will be described in further detail with reference to the attached drawings, in which.

DETAILED DESCRIPTION OF THE EMBODIMENTS

Figure 1:
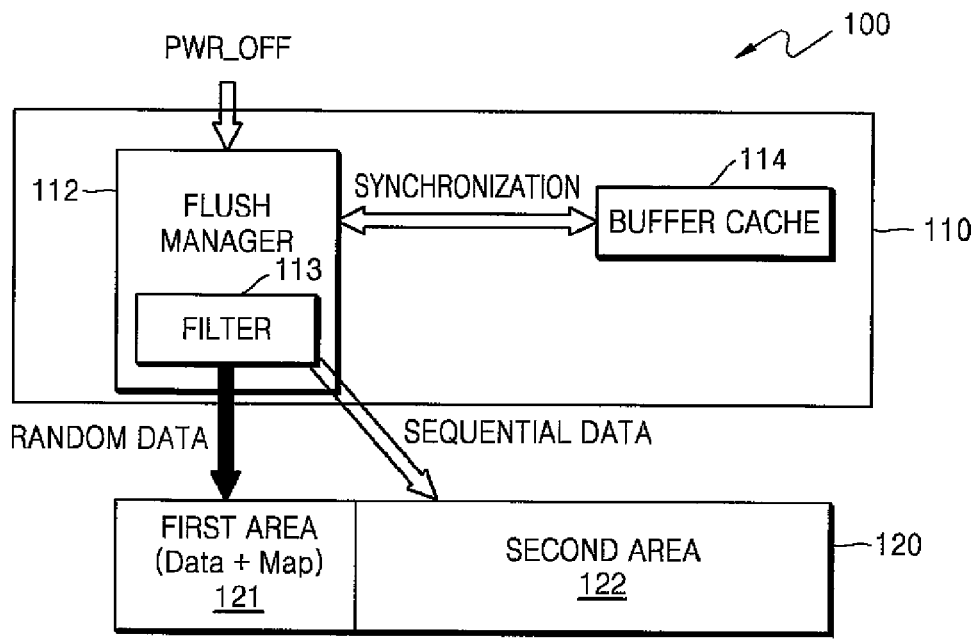
FIG. 1 is a functional block diagram of a system for cache synchronization, according to an embodiment of the inventive concept.

Embodiments of the inventive concept will now be described more fully with reference to the accompanying drawings, in which illustrative embodiments are shown, to gain a sufficient understanding of the inventive concept. The inventive concept, however, may be embodied in various different forms, and should not be construed as being limited only to the illustrated embodiments. Rather, these embodiments are provided as examples, to convey the inventive concept to one skilled in the art. Accordingly, known processes, elements, and techniques are not described with respect to some of the embodiments. Throughout the drawings and written description, like reference numerals will be used to refer to like or similar elements.

FIG. 1 is a functional block diagram of a system 100, according to an illustrative embodiment. Referring to FIG. 1, the system 100 according to the present embodiment includes a data managing unit 110 and a storage medium 120. The data managing unit 110 provides a file system for storing files in a flash memory device and for managing files read from the flash memory device. For example, the data managing unit 110 may be a host driver using a flash memory device as a storage medium, or may be a Flash Translation Layer (FTL). The storage medium 120 may be a flash memory-based storage medium, such as a solid-state disk (SSD), for example. For convenience of description, the storage medium 120 will be referred to as flash memory device 120.

The data managing unit 110 includes a flush manager 112 and a buffer cache 114. The flush manager 112 receives an event signal, such as a power-off signal PWR_OFF from a host (not shown). In response to the power-off signal PWR_OFF, the flush manager 112 performs a cache synchronization operation for controlling the storing of data temporarily stored in the buffer cache 114 in the flash memory device 120 for performing a fast power-off. A filter 113 in the flush manager 112 determines whether each of the data (that is, each piece of data) stored in the buffer cache 114 is random data or sequential data, capable of being sequentially written. The buffer cache 114 is formed as a volatile memory device, such as static random access memory (SRAM) or dynamic random access memory (DRAM).

The flash memory device 120 includes a memory area that is divided into a first area 121 and a second area 122. The first area 121 is configured to store random data from the buffer cache 114, and the second area 122 is configured to store sequential data from the buffer cache 114. In various embodiments, the first area 121 and the second area 122 may be distinguishable areas within one flash memory device, or may be respectively embodied as separate flash memory devices.

The random data are stored in the first area 121 of the flash memory device 120 along with a physical address information map that allows the random data to be sequentially stored in the first area 121. The physical address information map indicates the relationship between physical addresses of the random data stored in the buffer cache 114 and physical addresses of the random data stored in the first area 121 of the flash memory device 120. The sequential data are sequentially stored in the second area 122 of the flash memory device 120, respectively having the same addresses as the addresses in the buffer cache 114.

Figure 2:
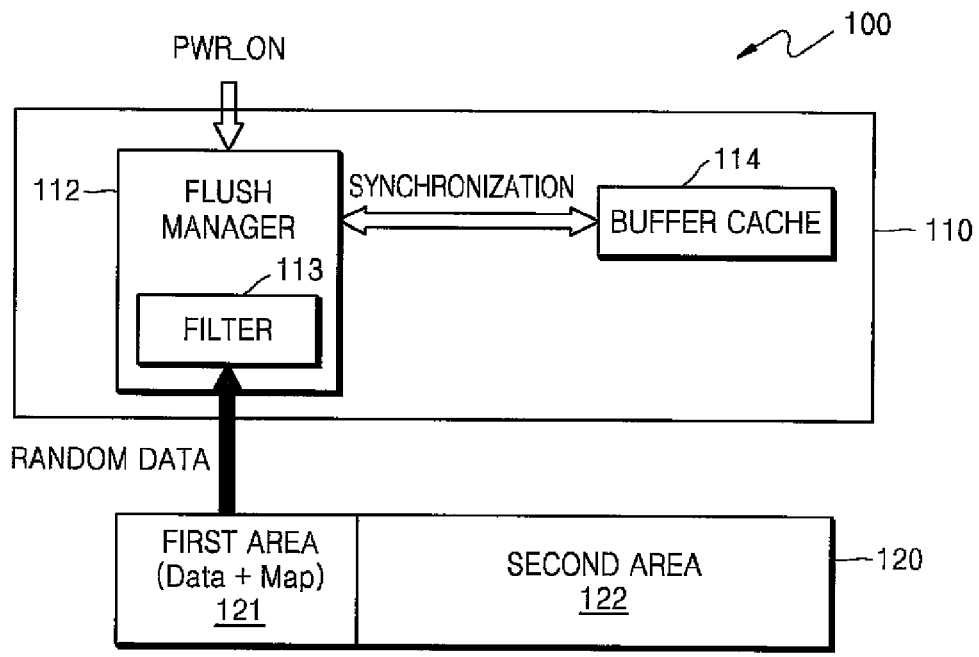
FIG. 2 is a functional block diagram of the system of FIG. 1, for describing a power-on operation, according to an embodiment of the inventive concept.

FIG. 2 is a functional block diagram of the system 100 of FIG. 1, for describing a power-on operation, according to an illustrative embodiment. Referring to FIG. 2, in response to a received power-on signal PWR_ON, the flush manager 112 reconstructs the data stored in the flash memory device 120 into the buffer cache 114. The filter 113 in the flush manager 112 restores the random data stored in the first area 121 of the flash memory device 120 to the buffer cache 114 according to the physical address information map. The sequential data stored in the second area 122 of the flash memory device 120 may or may not be restored to the buffer cache 114. When the sequential data are not restored to the buffer cache 114, the flush manager 112 fetches the sequential data stored in the second area 122 of the flash memory device 120 according to information missing in the buffer cache 114.

Figure 3:
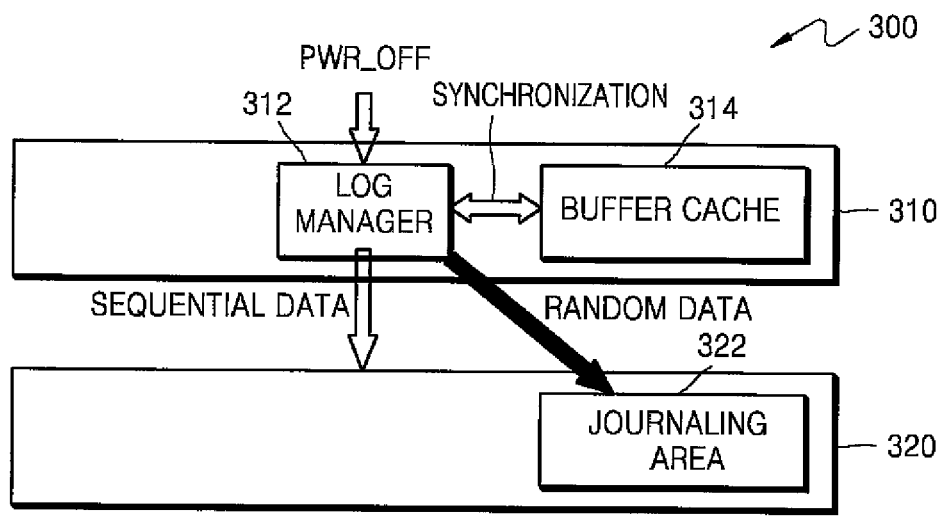
FIG. 3 is a functional block diagram of a system for cache synchronization, according to another embodiment of the inventive concept.

FIG. 3 is a functional block diagram of a system 300 according to another illustrative embodiment. Referring to FIG. 3, the system 300 according to the present embodiment includes a data managing unit 310 and a flash memory device 320. To guard against a sudden power-off, the data managing unit 310 implementing a file system provides journaling of logging operations related to the file system. The journaling is performed to insure a journaling area 322 in the flash memory device 320, where the journaling area 322 stores log information.

The data managing unit 310 includes a log manager 312 and a buffer cache 314. The log manager 312 performs the journaling. Also, in response to a received power-off signal PWR_OFF, the log manager 312 performs a cache synchronization operation for storing the data stored in the buffer cache 314 in the flash memory device 320. The log manager 312 determines whether each of the data stored in the buffer cache 314 are random data or sequential data. The log manager 312 thus stores the random data along with a physical address information map enabling sequential storage of the random data in the journaling area 322, and stores the sequential data in an area other than the journaling area 322 in the flash memory device 320. The physical address information map indicates the relationship between physical addresses of the random data stored in the buffer cache 314 and physical addresses of the random data stored in the journaling area 322 of the flash memory device 320.

Figure 4:
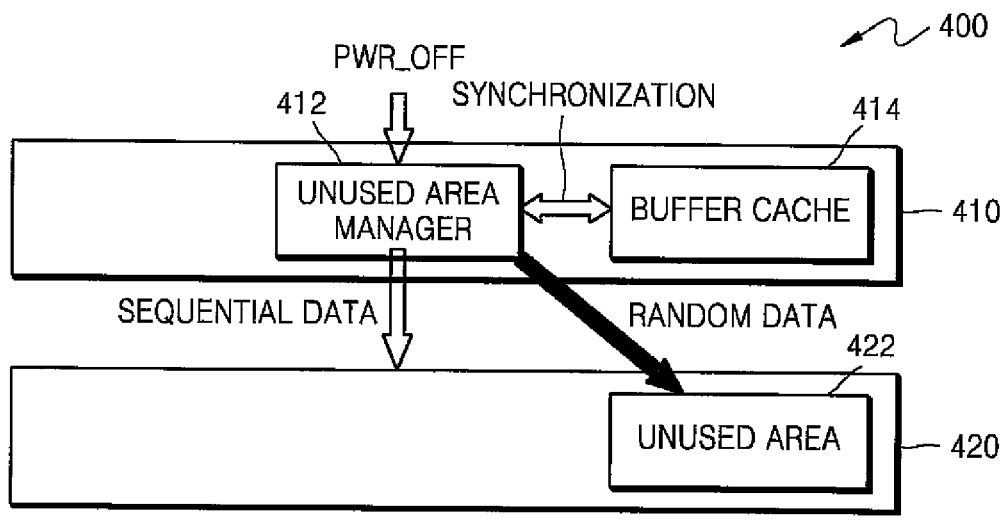
FIG. 4 is a functional block diagram of a system for cache synchronization, according to another embodiment of the inventive concept.

FIG. 4 is a functional block diagram of a system 400, according to another illustrative embodiment. Referring to FIG. 4, the system 400 according to the present embodiment includes a data managing unit 410 and a flash memory device 420. The data managing unit 410 implementing a file system divides an area of the flash memory device 420 into a used area containing data and an unused area (i.e., a free area), and manages the areas. When the flash memory device 420 is used for storing MPEG-1 Audio Layer 3 (MP3) files or moving picture files, for example, multiple unused areas may be sequentially located in the flash memory device 420.

The data managing unit 410 includes an unused area manager 412 and a buffer cache 414. The unused area manager 412 manages the multiple unused areas in the flash memory device 420. Also, in response to a received power-off signal PWR_OFF, the unused area manager 412 performs a cache synchronization operation for storing data stored in the buffer cache 414 in the flash memory device 420. The unused area manager 412 determines whether each of the data stored in the buffer cache 414 are random data or sequential data. The unused area manager 412 thus stores the random data along with a physical address information map changed for sequential data storage in an unused area 422 in the flash memory device 420, and stores the sequential data in an area other than the unused area 422 in the flash memory device 420. The physical address information map indicates the relationship between physical addresses of the random data stored in the buffer cache 414 and physical addresses of the random data stored in the unused area 422 of the flash memory device 420.

Therefore, cache synchronization performed on a flash memory device-based storage medium, according to various embodiments of the inventive concept, sequentially stores random data stored in the buffer cache along with an address information map in a pre-established area in the flash memory device.

While the inventive concept has been shown and described with reference to exemplary embodiments, it will be apparent to those skilled in the art that various changes and modifications may be made without departing from the spirit and scope of the present teachings. Therefore, it should be understood that the above embodiments are not limiting, but illustrative.

What is claimed is:

1. A system for cache synchronization comprising:
   a data managing unit configured to control storing of data of a buffer cache of a storage medium, in response to an event signal received from a host, by classifying the data of the buffer cache into random data and sequential data; and
   the storage medium comprising a first area and a second area, the storage medium configured to store the random data and an address information map in the first area, and to store the sequential data in the second area.

2. The system of claim 1, wherein the address information map comprises information representing a relationship between physical addresses of the random data stored in the buffer cache and physical addresses of the random data stored in the first area of the storage medium.

3. The system of claim 1, wherein the event signal comprises a power-off signal indicating a power-off condition of the system.

4. The system of claim 1, wherein the data managing unit restores the random data stored in the first area of the storage medium to the buffer cache according to the address information map in response to a power-on signal, indicating a power-on condition of the system.

5. The system of claim 1, wherein the storage medium comprises a flash memory device in which the first area and the second area are distinguished.

6. The system of claim 1, wherein the first area corresponds to an unused area and the second area corresponds to a used area in the storage medium.

7. The system of claim 6, wherein the storage medium is a solid-state disk (SSD).

8. A system for cache synchronization comprising:
   a data managing unit providing a journaling function for storing log information and storing data of a buffer cache of a storage medium by classifying the data of the buffer cache into random data and sequential data in response to an event signal received from a host;
   the storage medium comprising a journaling area for storing the log information, the storage medium storing the random data along with an address information map in the journaling area, and storing the sequential data in an area other than the journaling area.

9. The system of claim 8, wherein the address information map comprises information representing a relationship between physical addresses of the random data stored in the buffer cache and physical addresses of the random data stored in the storage medium.

10. The system of claim 8, wherein the storage medium is a flash memory-based storage medium.

11. The system of claim 10, wherein the storage medium is a solid-state disk (SSD).

12. A cache synchronization method, comprising:
   receiving an event signal from a host;
   storing data of a buffer cache in a storage medium in response to the event signal by classifying the data of the buffer cache into random data and sequential data;
   storing the random data and an address information map in a first area of the storage medium; and
   storing the sequential data in a second area in the storage medium.

13. The cache synchronization method of claim 12, wherein the address information map comprises information representing a relationship between physical addresses of the random data stored in the buffer cache and physical addresses of the random data stored in the storage medium, in response to the event signal.

14. The cache synchronization method of claim 12, wherein the first area indicates a journaling area in the storage medium for storing log information.

15. The cache synchronization method of claim 12, wherein the first area corresponds to an unused area in the storage medium.

16. The cache synchronization method of claim 12, wherein the storage medium is a flash memory-based storage medium.

17. The cache synchronization method of claim 16, wherein the storage medium is a solid-state disk (SSD).

* * * * *